(12) United States Patent
Masuko et al.

(10) Patent No.: US 8,373,283 B2
(45) Date of Patent: Feb. 12, 2013

(54) ADHESIVE COMPOSITION, FILM-LIKE ADHESIVE, ADHESIVE SHEET AND SEMICONDUCTOR DEVICE

(75) Inventors: Takashi Masuko, Tsukuba (JP); Shigeki Katogi, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 97 days.

(21) Appl. No.: 13/057,322

(22) PCT Filed: Apr. 30, 2009

(86) PCT No.: PCT/JP2009/058502
§ 371 (c)(1),
(2), (4) Date: Apr. 21, 2011

(87) PCT Pub. No.: WO2010/016305
PCT Pub. Date: Feb. 11, 2010

(65) Prior Publication Data
US 2011/0187009 A1  Aug. 4, 2011

(30) Foreign Application Priority Data

Aug. 4, 2008 (JP) ............... P2008-200347
Oct. 30, 2008 (JP) ............... P2008-279988

(51) Int. Cl.
*H01L 23/52* (2006.01)
*H01L 23/48* (2006.01)
*H01L 29/40* (2006.01)

(52) U.S. Cl. ............... 257/783; 257/E29.002; 257/798; 438/118; 438/617; 524/105

(58) Field of Classification Search ........... 257/E29.002, 257/782, 783, 786, 798; 438/118, 612, 614, 438/617, 666; 524/105, 127, 140, 141; 523/435, 523/461; 428/355 EP, 355 N
See application file for complete search history.

(56) References Cited

U.S. PATENT DOCUMENTS

| 4,604,230 | A | | 8/1986 | Goswami et al. | |
|---|---|---|---|---|---|
| 5,290,882 | A | * | 3/1994 | Shiobara et al. | 525/422 |
| 5,340,851 | A | * | 8/1994 | Shiobara et al. | 523/443 |
| 6,346,598 | B1 | * | 2/2002 | Hashimoto et al. | 528/322 |
| 6,713,143 | B2 | * | 3/2004 | Hashimoto et al. | 428/40.1 |

(Continued)

FOREIGN PATENT DOCUMENTS

| JP | 3-192178 | 8/1991 |
|---|---|---|
| JP | 4-196246 | 7/1992 |

(Continued)

OTHER PUBLICATIONS

K. Ambika Devi, et al., Diallyl Bisphenol A-Novolac Epoxy System Cocured with Bisphenol-A-Bismaleimide-Cure and Thermal Properties, Journal of Applied Polymer Science, 2007, pp. 1192-1200, vol. 106.

(Continued)

*Primary Examiner* — Chris Chu
(74) *Attorney, Agent, or Firm* — Antonelli, Terry, Stout & Kraus, LLP.

(57) ABSTRACT

The adhesive composition of the invention comprises (A) a thermoplastic resin with a Tg of no higher than 100° C. and (B) a thermosetting component, wherein the (B) thermosetting component includes (B1) a compound with an allyl group and (B2) a compound with a maleimide group.

11 Claims, 8 Drawing Sheets

U.S. PATENT DOCUMENTS

| | | |
|---|---|---|
| 6,784,234 B2 * | 8/2004 | Adedeji et al. ............... 524/140 |
| 7,273,014 B2 * | 9/2007 | Adedeji et al. ............. 108/57.28 |
| 2002/0106521 A1 | 8/2002 | Hashimoto et al. |

FOREIGN PATENT DOCUMENTS

| | | |
|---|---|---|
| JP | 4-234472 | 8/1992 |
| JP | 9-17810 | 1/1997 |
| JP | 3014578 | 12/1999 |
| JP | 2002-180012 | 6/2002 |
| JP | 2002-241722 | 8/2002 |
| JP | 2002-285103 | 10/2002 |
| JP | 2003-277710 | 10/2003 |
| TW | 200738841 | 10/2007 |
| TW | I296643 | 5/2008 |
| WO | WO 2007/083810 A1 | 7/2007 |

OTHER PUBLICATIONS

Extended European Search Report dated Jan. 4, 2012, including Supplementary European Search Report and European Search Opinion, for EP Application No. 09804792.1-2115 / 2311921 (PCT/JP2009/058502).

Translation of the International Preliminary Report on Patentability dated Mar. 17, 2011, for International Application No. PCT/JP2009/058502, filed Apr. 30, 2009.

Communication mailed Sep. 18, 2012, in connection with Japanese Patent Application No. 2010-523790, 2 pages, Japanese Patent Office, Japan.

Communication mailed Aug. 10, 2012, in connection with Taiwanese Patent Application No. 098115160, 6 pages, Taiwanese Patent Office, Taiwan.

* cited by examiner

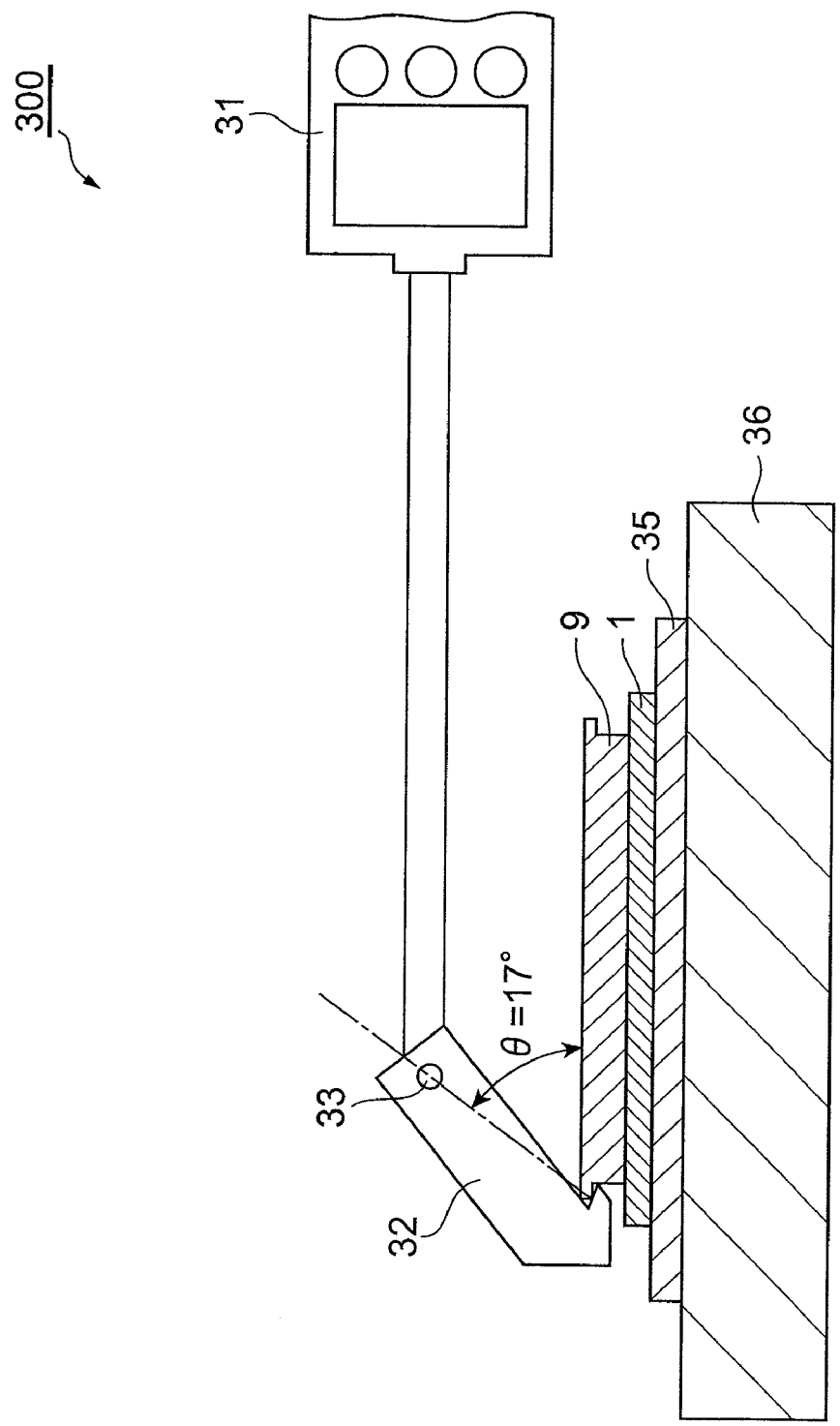

ADHESIVE COMPOSITION, FILM-LIKE ADHESIVE, ADHESIVE SHEET AND SEMICONDUCTOR DEVICE

The present application claims priority to Japanese Patent Application No. JP2008-200347, filed Aug. 4, 2008 and Japanese Patent Application No. JP2008-279988, filed Oct. 30, 2008, as well as International Patent Application No. PCT/JP2009/058502. The present application claims priority to these previously filed applications.

TECHNICAL FIELD

The present invention relates to an adhesive composition, a film-like adhesive, an adhesive sheet and a semiconductor device.

BACKGROUND ART

Bonding between semiconductor elements and semiconductor element-mounting supporting members has conventionally been accomplished using silver pastes, for the most part. However, the increasing sizes of semiconductor elements and decreasing sizes and higher performance of semiconductor packages in recent years have also led to demand for smaller and more minute supporting members to be used in them. It is becoming impossible to meet this demand with silver pastes, because of runover due to wetting spread, wire bonding defects caused by the gradient of the semiconductor element, difficulty of thickness control of the silver paste, and generation of voids in the silver paste. In recent years, therefore, film-like adhesives that can help meet the demand have come into use (see Patent documents 1 and 2, for example).

Such film-like adhesives are used in methods for producing semiconductor devices that employ short bar attachment systems or wafer back-side attachment systems. For production of a semiconductor device by a short bar attachment system, first a film-like adhesive reel is cut out into short bars by cutting or punching and then bonded to a supporting member, and semiconductor elements individuated by a dicing step are connected to the film-like adhesive-attached supporting member to fabricate a semiconductor element-attached supporting member. This is followed by a wire bond step, sealing step and the like to obtain a semiconductor device (see Patent document 3, for example). In short bar attachment systems, however, a special assembly apparatus is necessary to cut out the film-like adhesive and bond it to the supporting member, and therefore production cost has been higher than methods using silver paste.

For production of semiconductor devices by a wafer back-side attachment system, on the other hand, first one side of a film-like adhesive is attached onto the back side of a semiconductor wafer, and a dicing sheet is pasted onto the other side of the film-like adhesive. The semiconductor element is then individuated from the semiconductor wafer by dicing, and the individuated film-like adhesive-attached semiconductor elements are picked up and connected to the supporting member. A semiconductor device is then obtained through steps such as wire bond and sealing. A wafer back-side attachment system does not require a special assembly apparatus for cutting out of the film-like adhesive and bonding to the supporting member, and a conventional assembly apparatus for silver paste may be used either in its original form or with part of the apparatus modified by addition of a heating plate or the like. Wafer back-side attachment systems have therefore been of interest as methods whereby production cost can be relatively limited, among methods using film-like adhesives (see Patent document 4, for example).

In recent years, incidentally, advances have been made in terms of the multifunctionality of semiconductor elements, in addition to their size reduction and higher performance, and there has been a surge in the number of semiconductor devices comprising stacks of semiconductor elements. The trend is also toward reduced thicknesses of semiconductor devices. Semiconductor wafers therefore continue to be further reduced in thickness.

In order to simplify the assembly process as well, methods have been proposed that simplify the attachment process onto the wafer back side, by preparing an adhesive sheet having a dicing sheet attached onto one side of a film-like adhesive, i.e. a film integrally comprising a dicing sheet and a die bond film (this will hereinafter be referred to as "dicing/die bond integrated film"). Because such methods can simplify the process of attachment of the film onto the wafer back side, they can lower the risk of wafer cracking. The softening temperature of the dicing tape is usually no higher than 100° C. Even with the integrated film described above, therefore, a film-like adhesive must be able to attach at low temperatures of below 100° C., in consideration of the softening temperature of the dicing tape, and of inhibiting wafer warping, in addition to having the satisfactory process properties mentioned above.

Semiconductor devices fabricated using film-like adhesives must also have reliability, or in other words, heat resistance, humidity resistance, reflow resistance and the like. In order to ensure reflow resistance it is necessary to exhibit high bonding strength that can prevent peeling or destruction of the die bond layer at a reflow heating temperature of around 260° C. Thus, demand is increasing for film-like adhesives that can exhibit high degrees of both process properties including a low-temperature lamination property, and reliability for semiconductor devices, including reflow resistance.

When the supporting member is an organic substrate with wiring on the surface, it is important for the film-like adhesive to have a sufficient filling property (embedding property) at different wiring levels, in order to ensure moisture-proof reliability of the semiconductor device and interconnect insulating reliability.

Film adhesives comprising combinations of thermoplastic resins with relatively low Tg and thermosetting resins have hitherto been proposed, in order to achieve both low-temperature workability and heat resistance (see Patent document 5, for example).

PRIOR ART DOCUMENTS

Patent Documents

[Patent document 1] Japanese Unexamined Patent Application Publication HEI No. 3-192178
[Patent document 2] Japanese Unexamined Patent Application Publication HEI No. 4-234472
[Patent document 3] Japanese Unexamined Patent Application Publication HEI No. 9-17810
[Patent document 4] Japanese Unexamined Patent Application Publication HEI No. 4-196246
[Patent document 5] Japanese Patent Publication No. 3014578

SUMMARY OF THE INVENTION

Technical Problem

The prior art mentioned above, however, is still inadequate for providing materials that can satisfy the requirements of ensuring hot flow properties that allow embedding into wiring levels on the substrate surface, and exhibiting low-stress properties to inhibit chip warping as well as heat resistance at high temperature, including reflow resistance. More detailed or elaborate material designs are therefore necessary toward the development of materials that can satisfy these various properties to a high degree.

Designs for achieving both low-temperature workability and heat resistance that have been hitherto proposed include resin compositions comprising a polyimide resin or acrylic rubber with a relatively low Tg and an epoxy resin, as well as designs wherein the proportion of addition of epoxy resin with low molecular weight and low viscosity is increased, with the aim of obtaining both a hot flow property so that the wiring levels on the substrate surface in the B stage are filled in, and heat resistance in the C stage. With a greater amount of epoxy resin, however, various problems arise, such as increase in the amount of ionic impurities in the system as a whole, increase in thermal stress, and lowered heat resistance.

It is an object of the present invention, which has been accomplished in light of the aforementioned problems of the prior art, to provide an adhesive composition that can satisfy the requirements of low-temperature attachment property (low-temperature laminating property) and of hot flow property in the B stage and of reflow resistance and that can sufficiently inhibit chip warping, as well as a film-like adhesive, adhesive sheet and semiconductor device that employ the same.

Solution to Problem

In order to achieve the object stated above, the invention provides an adhesive composition comprising (A) a thermoplastic resin with a Tg of no higher than 100° C. and (B) a thermosetting component, wherein the (B) thermosetting component includes (B1) a compound with an allyl group and (B2) a compound with a maleimide group.

According to this adhesive composition, having the construction described above, it is possible to obtain a satisfactory low-temperature attachment property and an excellent hot flow property in the B stage, and it is thus possible to adequately satisfy the filling property (embedding property) required for irregularities on adherend surfaces under conditions of low temperature, low pressure and rapidity during die bonding, while also ensuring a high degree of reliability for semiconductor devices, such as reflow resistance. In addition, an adhesive composition having this construction has excellent process properties, including an improved elastic modulus due to the thermal history of precuring (step curing) and/or wire bonding after die bonding, increased ultrasonic efficiency during wire bonding, and also limited increase in chip warping due to the thermal history.

The (A) thermoplastic resin in the adhesive composition of the invention is preferably a polyimide resin from the viewpoint of heat resistance, purity and satisfactory adhesion onto adherends.

The (B1) compound with an allyl group in the adhesive composition of the invention is preferably a compound also containing an epoxy group. This can provide an effect of increasing the crosslink density as the number of thermal reactive groups increases, so that the obtained adhesive composition can more adequately satisfy the requirements for low-temperature attachment property, low chip warping and reflow resistance. It is even more preferred to use a polyimide resin as the (A) thermoplastic resin, to obtain an effect of increased crosslink density due to thermal reaction between the reactive groups in the oligomer end groups, for example, and the epoxy groups.

The (B) thermosetting component in the adhesive composition of the invention preferably further comprises (B3) an epoxy resin. This can provide an effect of even greater crosslink density due to thermal reaction between the epoxy groups and the reactive groups in the oligomer end groups, for example, when a polyimide resin is used in the (A) thermoplastic resin, to allow more adequately satisfactory low-temperature attachment properties and reflow resistance to be obtained.

The adhesive composition of the invention preferably further contains (C) a filler. This can impart cuttability during dicing, detachability from the dicing tape during pickup and high elasticity during the thermal history of semiconductor device assembly, while also further improving the low hygroscopicity and the elastic modulus during reflow heating, as well as the reflow resistance, due to increased breaking strength.

The adhesive composition of the invention is preferably one used for bonding of semiconductor elements to other semiconductor elements or to semiconductor element-mounting supporting members. The adhesive composition of the invention, which exhibits the effects described above, may therefore be suitably used for bonding of semiconductor elements to other semiconductor elements or to semiconductor element-mounting supporting members. In addition, since the adhesive composition of the invention has an excellent hot flow property which allows filling in of wiring levels of substrate surfaces under conditions of low temperature, low pressure and with rapidity during die bonding, and can also inhibit increase in chip warping due to the thermal history of assembly, it is particularly suitable for connection between semiconductor elements and wiring level-bearing organic substrates serving as semiconductor element-mounting supporting members.

The invention further provides a film-like adhesive obtained by forming the adhesive composition of the invention into a film shape. Because such a film-like adhesive comprises an adhesive composition of the invention, it has excellent process properties for production of semiconductor devices, including sufficient hot flow properties, to ensure the filling property (embedding property) for adherends, and low-temperature attachment properties and low chip warping, as well as excellent reliability for semiconductor devices, including reflow resistance, while its film shape facilitates handling and contributes to a more efficient semiconductor device assembly process. In particular, the film-like adhesive can simplify the attachment steps up to the dicing step, and can ensure stable characteristics even against the thermal history during package assembly.

The present invention further provides an adhesive sheet comprising a support substrate and the film-like adhesive of the invention formed on the main side of the support substrate. Since such an adhesive sheet has the film-like adhesive of the invention laminated on the support substrate, it is possible to obtain a similar effect as the film-like adhesive while further facilitating handling, such as manageability during attachment.

The support substrate in the adhesive sheet of the invention is preferably a dicing sheet. Such an adhesive sheet has the function of both a dicing sheet and a die bonding film, and can therefore further simplify the production steps for semiconductor devices. The dicing sheet is preferably one having a base film and a pressure-sensitive adhesive layer provided on the base film.

The invention still further provides a semiconductor device having a structure with a semiconductor element and a semiconductor element-mounting supporting member bonded by the adhesive composition of the invention, and/or a structure with adjacent semiconductor elements bonded together. Since such a semiconductor device has a semiconductor element and a semiconductor element-mounting supporting member, and/or adjacent semiconductor elements, bonded by the adhesive composition of the invention, it exhibits high performance and high function, as well as excellent reliability (reflow resistance and the like). Such a semiconductor device has superior productivity and excellent bonding strength when hot and humidity resistance.

Advantageous Effects of Invention

According to the invention it is possible to provide a wafer back-side attachment-type adhesive composition and film-like adhesive that can be applied for ultrathin wafers and semiconductor devices comprising multiple laminated semiconductor elements. When a film-like adhesive is attached to a wafer back side, heating is usually performed to the temperature at which the film-like adhesive melts, but by using a film-like adhesive of the invention it is possible to accomplish attachment to a wafer back side at low temperature, which allows wafer warping to be minimized. This can reduce thermal stress as well, and solve the problem of warping of wafers that continue to increase in size and decrease in thickness.

Also, the adhesive composition and film-like adhesive of the invention can ensure hot flow properties that allow wiring levels on substrate surfaces to be satisfactory filled in, and can be suitably used in production steps for semiconductor devices comprising multiple laminated semiconductor elements. Furthermore, because high bonding strength at high temperature can be ensured, it is possible to increase the heat resistance and moisture-proof reliability, and to further simplify the production steps for semiconductor devices.

In addition, the adhesive composition and film-like adhesive of the invention, wherein the composition of the adhesive is optimized, can further reduce thermal stress, including inhibiting wafer warping and inhibiting chip warping caused by cure shrinkage of the film-like adhesive, while also preventing chip fly-off during dicing, and providing pickup properties, manageability during production of semiconductor devices, and low outgas properties.

According to the invention it is also possible to provide an adhesive sheet obtained by attaching the film-like adhesive and a dicing sheet. According to the adhesive sheet of the invention it is possible to provide a material that simplifies the attachment steps up to the dicing step and can ensure stable properties against the thermal history of package assembly.

Also, according to the invention, it is possible to provide an adhesive sheet comprising an adhesive layer and a substrate, having both the functions of a dicing sheet and a die bond film.

Furthermore, according to the invention, it is possible to provide a semiconductor device employing the film-like adhesive described above. The semiconductor device of the invention is a semiconductor device with excellent reliability, obtained through simplified production steps. The semiconductor device of the invention exhibits the heat resistance and humidity resistance required for mounting of semiconductor elements with large differences in thermal expansion coefficient, onto semiconductor element-mounting supporting members.

BRIEF DESCRIPTION OF DRAWINGS

FIG. 8 is a schematic diagram of a peel strength tester.

DESCRIPTION OF EMBODIMENTS

Figure 1:
FIG. 1 is a schematic cross-sectional view showing an embodiment of a film-like adhesive according to the invention.

Preferred embodiments of the invention will now be explained in detail, with reference to the accompanying drawings as necessary. Identical or corresponding parts in the drawings will be referred to by like reference numerals and will be explained only once. Unless otherwise specified, the vertical and horizontal positional relationships are based on the positional relationships in the drawings. Also, the dimensional proportions depicted in the drawings are not necessarily limitative. The term "(meth)acrylic" used throughout the present specification refers to the "acrylic" compound and its corresponding "methacrylic" compound.

FIG. 1 is a schematic cross-sectional view showing a film-like adhesive according to a preferred embodiment of the invention. The film-like adhesive 1 comprises an adhesive composition of the invention shaped into a film. The thickness of the film-like adhesive 1 is preferably 1-200 μm. The form of the film-like adhesive may be a monolayer film-like adhesive 1, as shown in FIG. 1. For this form, the film-like adhesive 1 preferably is a tape-like form with a width of about 1-20 mm or a sheet-like form with a width of about 10-50 cm, and is transported into a state wound around a winding core. This will facilitate storage and transport of the film-like adhesive 1. The film-like adhesive 1 may be a film comprising a monolayer film stacked and attached over itself, in order to obtain a thick film.

Figure 2:
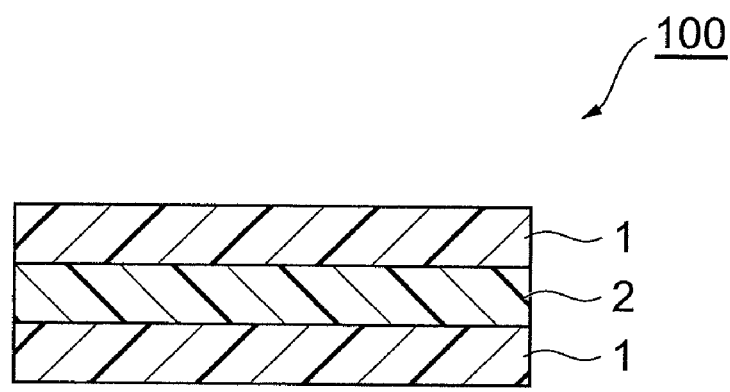
FIG. 2 is a schematic cross-sectional view showing an embodiment of an adhesive sheet according to the invention.

The film-like adhesive 1 may be used as an adhesive sheet having a structure with the film-like adhesive 1 laminated on one or both sides of a support substrate. FIG. 2 is a schematic cross-sectional view showing an adhesive sheet according to a preferred embodiment of the invention. The adhesive sheet 100 shown in FIG. 2 comprises a base film 2 as the support substrate and a film-like adhesive 1 as an adhesive layer formed on both main sides thereof.

Figure 3:
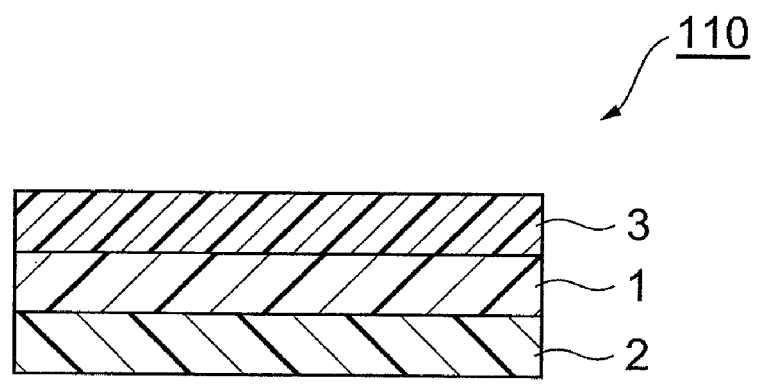
FIG. 3 is a schematic cross-sectional view showing another embodiment of an adhesive sheet of the invention.

FIG. 3 is a schematic cross-sectional view showing another embodiment of an adhesive sheet of the invention. The adhesive sheet 110 shown in FIG. 3 comprises a film-like adhesive 1 and a protective film (cover film) 3 laminated in that order on one main side of the base film 2. The protective film 3 is provided covering the film-like adhesive 1, in order to prevent damage or contamination of the film-like adhesive 1. In this case, the film-like adhesive 1 is used for die bonding after releasing the protective film 3.

The film-like adhesive 1 is obtained from an adhesive composition of the invention. The adhesive composition will now be explained in detail.

The adhesive composition of the invention comprises (A) a thermoplastic resin with a Tg of no higher than 100° C. and (B) a thermosetting component, wherein the (B) thermosetting component includes (B1) a compound with an allyl group and (B2) a compound with a maleimide group.

The (A) thermoplastic resin with a Tg of no higher than 100° C. is not particularly restricted, and for example, it may be at least one type of resin selected from the group consisting of polyimide resins, polyamide resins, polyamideimide resins, polyetherimide resins, polyurethaneimide resins, polyurethaneamideimide resins, siloxanepolyimide resins, polyesterimide resins, or copolymers of the foregoing, as well as phenoxy resins, polysulfone resins, polyethersulfone resins, polyphenylene sulfide resins, polyester resins, polyetherketone resins, polyvinyl alcohol resins, polyvinyl butyral resins, styrene-maleimide copolymers, maleimide-vinyl compound copolymers, and (meth)acrylic copolymers with weight-average molecular weights of 100,000-1,000,000, among which polyimide resins are preferably used. These thermoplastic resins may be used alone or in combinations of two or more.

The temperature allowing attachment of the film-like adhesive of the invention onto a semiconductor wafer back side is preferably no higher than the softening temperatures of the semiconductor wafer protective tape and the dicing tape. Also, from the viewpoint of inhibiting warping of the semiconductor wafer, the attachment temperature is preferably 10-150° C., more preferably 20-100° C. and even more preferably 20-80° C. In order to allow attachment at such a temperature, the Tg of the film-like adhesive is preferably no greater than 100° C., and for this reason the Tg of the (A) thermoplastic resin is preferably no higher than 100° C. and more preferably between −20° C. and 80° C. If the Tg of the (A) thermoplastic resin exceeds 100° C., this will increase the potential for the attachment temperature onto semiconductor wafer back sides to exceed 150° C., while if the Tg is below −20° C., the tack of the film-like adhesive surface will be stronger in the B-stage state and the manageability will tend to be gradually impaired, and therefore neither extreme is desirable.

The Tg of the (A) thermoplastic resin is the primary dispersion peak temperature when the (A) thermoplastic resin is formed into a film, and the primary dispersion temperature is obtained by measurement of the tan δ peak temperature near Tg using a viscoelasticity analyzer by Rheometrix (trade name: RSA-2), under conditions with a film size of 35 mm×10 mm×40 μm thickness, a temperature-elevating rate of 5° C./min, a frequency of 1 Hz and a measuring temperature of between −150° C. and 300° C.

The polyimide resin as the (A) thermoplastic resin may be obtained, for example, by condensation reaction of a tetracarboxylic dianhydride and a diamine by a known process. Specifically, the compositional ratio is adjusted so that the tetracarboxylic dianhydride and diamine are in equimolar amounts in the organic solvent, or if necessary so that the total diamine content is in the range of 0.5-2.0 mol and preferably 0.8-1.0 mol with respect to 1.0 mol as the total tetracarboxylic dianhydrides (with any desired order of addition of the components), and addition reaction is conducted with a reaction temperature of no higher than 80° C. and preferably 0-60° C. The viscosity of the reaction mixture will gradually increase as the reaction proceeds, forming polyamide acid as the polyimide resin precursor. In order to prevent reduction in the properties of the adhesive composition, the tetracarboxylic dianhydride is preferably one that has been subjected to recrystallizing purifying treatment with acetic anhydride.

If the total diamine content exceeds 2.0 mol with respect to 1.0 mol as the total tetracarboxylic dianhydrides, in the compositional ratio of the tetracarboxylic dianhydride and diamine components for the condensation reaction, the amount of amine-terminal polyimide oligomers in the obtained polyimide resin will tend to be greater, and if the total diamine content is less than 0.5 mol the amount of acid-terminal polyimide oligomers will tend to be greater, while in both cases the weight-average molecular weight of the polyimide resin will be lowered, and the properties of the adhesive composition, including the heat resistance, will tend to be reduced. When an epoxy resin that is reactive with these ends is added, the storage stability of the adhesive composition tends to be impaired with increasing polyimide oligomer content, and this tendency is more notable as the amount of amine-terminal polyimide oligomer increases. The compositional ratio is therefore preferably kept within the range specified above. Since the epoxy resin also acts as a crosslinking agent for the polyimide resin, and especially the polyimide oligomer, the compositional ratio of the tetracarboxylic dianhydride and diamine is appropriately set in consideration of the properties required for the adhesive composition.

The tetracarboxylic dianhydride used is preferably one that, before use, has been subjected to heat drying for at least 12 hours at a temperature 10-20° C. lower than the melting point, or that has been subjected to purifying treatment by recrystallization from acetic anhydride. The difference between the endothermic starting temperature and the endothermic peak temperature measured using a differential scanning calorimeter (DSC), as the index of the purity of the tetracarboxylic dianhydride, is preferably within 10° C. The endothermic starting temperature and endothermic peak temperature are the values measured using a DSC (Model DSC-7 by Perkin-Elmer), under conditions with a sample weight of 5 mg, a temperature-elevating rate of 5° C./min and a measuring atmosphere of nitrogen.

The polyamide acid may be heated at a temperature of 50-80° C. for depolymerization to adjust the molecular weight. The polyimide resin may be obtained by dehydrating cyclization of the reaction product (polyamide acid). Dehydrating cyclization can be accomplished by thermal cyclization using heat treatment or by chemical cyclization using a dehydrating agent.

There are no particular restrictions on tetracarboxylic dianhydrides used as starting materials for the polyimide resin, and examples include pyromellitic acid dianhydride, 3,3',4,4'-biphenyltetracarboxylic dianhydride, 2,2',3,3'-biphenyltetracarboxylic dianhydride, 2,2-bis(3,4-dicarboxyphenyl)propane dianhydride, 2,2-bis(2,3-dicarboxyphenyl)propane dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, bis(3,4-dicarboxyphenyl)methane dianhydride, bis(3,4-dicarboxyphenyl)sulfone dianhydride, 3,4,9,10-perylenetetracarboxylic dianhydride, bis(3,4-dicarboxyphenyl)ether dianhydride, benzene-1,2,3,4-tetracarboxylic dianhydride, 3,4,3',4'-benzophenonetetracarboxylic dianhydride, 2,3,2',3'-benzophenonetetracarboxylic dianhydride, 3,3,3',4'-benzophenonetetracarboxylic dianhydride, 1,2,5,6-naphthalenetetracarboxylic dianhydride, 1,4,5,8-naphthalenetetracarboxylic dianhydride, 1,2,4,5-naphthalenetetracarboxylic dianhydride, 2,6-dichloronaphthalene-1,4,5,8-tetracarboxylic dianhydride, 2,7-dichloronaphthalene-1, 4,5,8-tetracarboxylic dianhydride, 2,3,6,7-tetrachloronaphthalene-1,4,5,8-tetracarboxylic dianhydride, phenanthrene-1,8,9,10-tetracarboxylic dianhydride, pyrazine-2,3,5,6-tetracarboxylic dianhydride, thiophene-2,3,5,6-tetracarboxylic dianhydride, 2,3,3',4'-biphenyltetracarboxylic dianhydride, 3,4,3',4'-biphenyltetracarboxylic dianhydride, 2,3,2',3'-biphenyltetracarboxylic dianhydride, bis(3,4-dicarboxyphenyl)dimethylsilane dianhydride, bis(3,4-dicarboxyphenyl)methylphenylsilane dianhydride, bis(3,4-dicarboxyphenyl)diphenylsilane dianhydride, 1,4-bis(3,4-dicarboxyphenyldimethylsilyl)benzene dianhydride, 1,3-bis(3,4-dicarboxyphenyl)-1,1,3,3-tetramethyldicyclohexane dianhydride, p-phenylenebis(trimellitate anhydride), ethylenetetracarboxylic dianhydride, 1,2,3,4-butanetetracarboxylic dianhydride, decahydronaphthalene-1,4,5,8-tetracarboxylic dianhydride, 4,8-dimethyl-1,2,3,5,6,7-hexahydronaphthalene-1,2,5,6-tetracarboxylic dianhydride, cyclopentane-1,2,3,4-tetracarboxylic dianhydride, pyrrolidine-2,3,4,5-tetracarboxylic dianhydride, cyclobutanetetracarboxylic dianhydride, bis(exo-bicyclo[2,2,1]heptane-2,3-dicarboxylic dianhydride, bicyclo-[2,2,2]-oct-7-ene-2,3,5,6-tetracarboxylic dianhydride, 2,2-bis(3,4-dicarboxyphenyl)propane dianhydride, 2,2-bis[4-(3,4-dicarboxyphenyl)phenyl]propane dianhydride, 2,2-bis(3,4-dicarboxyphenyl)hexafluoropropane dianhydride, 2,2-bis[4-(3,4-dicarboxyphenyl)phenyl]hexafluoropropane dianhydride, 4,4'-bis(3,4-dicarboxyphenoxy)diphenyl sulfide dianhydride, 1,4-bis(2-hydroxyhexafluoroisopropyl)benzenebis(trimellitic anhydride), 1,3-bis(2-hydroxyhexafluoroisopropyl)benzenebis(trimellitic anhydride), 5-(2,5-dioxotetrahydrofuryl)-3-methyl-3-cyclohexene-1,2-dicarboxylic dianhydride, tetrahydrofuran-2,3,4,5-tetracarboxylic dianhydride, 4,4'-oxydiphthalic acid dianhydride, 4,4'-(4,4'-isopropylidenediphenoxy)bis(phthalic acid dianhydride), 1,2-(ethylene)bis(trimellitate anhydride), 1,3-(trimethylene)bis(trimellitate anhydride), 1,4-(tetramethylene)bis(trimellitate anhydride), 1,5-(pentamethylene)bis(trimellitate anhydride), 1,6-(hexamethylene)bis(trimellitate anhydride), 1,7-(heptamethylene)bis(trimellitate anhydride), 1,8-(octamethylene)bis(trimellitate anhydride), 1,9-(nonamethylene)bis(trimellitate anhydride), 1,10-(decamethylene)bis(trimellitate anhydride), 1,12-(dodecamethylene)bis(trimellitate anhydride), 1,16-(hexadecamethylene)bis(trimellitate anhydride) and 1,18-(octadecamethylene)bis(trimellitate anhydride). Preferred among these are 4,4'-oxydiphthalic acid dianhydride and 4,4'-(4,4'-isopropylidenediphenoxy)bis(phthalic acid dianhydride), from the viewpoint of imparting excellent moisture-proof reliability, or 1,10-(decamethylene)bis(trimellitate anhydride), 1,12-(dodecamethylene)bis(trimellitate anhydride), 1,16-(hexadecamethylene)bis(trimellitate anhydride) and 1,18-(octadecamethylene)bis(trimellitate anhydride) from the viewpoint of imparting an excellent hot flow property. These tetracarboxylic dianhydrides may be used alone or in combinations of two or more.

There are no particular restrictions on diamines to be used as starting materials for the polyimide resin, and examples include aromatic diamines such as o-phenylenediamine, m-phenylenediamine, p-phenylenediamine, 3,3'-diaminodiphenyl ether, 3,4'-diaminodiphenyl ether, 4,4'-diaminodiphenyl ether, 3,3'-diaminodiphenylmethane, 3,4'-diaminodiphenylmethane, 4,4'-diaminodiphenylmethane, bis(4-amino-3,5-dimethylphenyl)methane, bis(4-amino-3,5-diisopropylphenyl)methane, 3,3'-diaminodiphenyldifluoromethane, 3,4'-diaminodiphenyldifluoromethane, 4,4'-diaminodiphenyldifluoromethane, 3,3'-diaminodiphenylsulfone, 3,4'-diaminodiphenylsulfone, 4,4'-diaminodiphenylsulfone, 3,3'-diaminodiphenyl sulfide, 3,4'-diaminodiphenyl sulfide, 4,4'-diaminodiphenyl sulfide, 3,3'-diaminodiphenylketone, 3,4'-diaminodiphenylketone, 4,4'-diaminodiphenylketone, 2,2-bis(3-aminophenyl)propane, 2,2'-(3,4'-diaminodiphenyl)propane, 2,2-bis(4-aminophenyl)propane, 2,2-bis(3-aminophenyl)hexafluoropropane, 2,2-(3,4'-diaminodiphenyl)hexafluoropropane, 2,2-bis(4-aminophenyl)hexafluoropropane, 1,3-bis(3-aminophenoxy)benzene, 1,4-bis(3-aminophenoxy)benzene, 1,4-bis(4-aminophenoxy)benzene, 3,3'-(1,4-phenylenebis(1-methylethylidene))bisaniline, 3,4'-(1,4-phenylenebis(1-methylethylidene))bisaniline, 4,4'-(1,4-phenylenebis(1-methylethylidene))bisaniline, 2,2-bis(4-(3-aminophenoxy)phenyl)propane, 2,2-bis(4-(3-aminophenoxy)phenyl)hexafluoropropane, 2,2-bis(4-(4-aminophenoxy)phenyl)hexafluoropropane, bis(4-(3-aminophenoxy)phenyl)sulfide, bis(4-(4-aminophenoxy)phenyl)sulfide, bis(4-(3-aminophenoxy)phenyl)sulfone, bis(4-(4-aminophenoxy)phenyl)sulfone, 3,3'-dihydroxy-4,4'-diaminobiphenyl and 3,5-diaminobenzoic acid, aliphatic diamines such as 1,3-bis(aminomethyl)cyclohexane, 2,2-bis(4-aminophenoxyphenyl)propane, 4,7,10-trioxamidecane-1,13-diamine or 4,9-dioxadecane-1,12-diamine, and polyoxyalkylenediamines such as JEFFAMINE D-230, D-400, D-2000, D-4000, ED-600, ED-900, ED-2001 and EDR-148 by San Techno Chemical Co., Ltd. or Polyetheramine D-230, D-400 and D-2000 by BASF, as well as aliphatic diamines such as 1,2-diaminoethane, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, 1,12-diaminododecane and 1,2-diaminocyclohexane, and siloxanediamines such as 1,1,3,3-tetramethyl-1,3-bis(4-aminophenyl)disiloxane, 1,1,3,3-tetraphenoxy-1,3-bis(4-aminoethyl)disiloxane, 1,1,3,3-tetraphenyl-1,3-bis(2-aminoethyl)disiloxane, 1,1,3,3-tetraphenyl-1,3-bis(3-aminopropyl)disiloxane, 1,1,3,3-tetramethyl-1,3-bis(2-amino ethyl)disiloxane, 1,1,3,3-tetramethyl-1,3-bis(3-aminopropyl)disiloxane, 1,1,3,3-tetramethyl-1,3-bis(3-aminobutyl)disiloxane, 1,3-dimethyl-1,3-dimethoxy-1,3-bis(4-aminobutyl)disiloxane, 1,1,3,3,5,5-hexamethyl-1,5-bis(4-aminophenyl)trisiloxane, 1,1,5,5-tetraphenyl-3,3-dimethyl-1,5-bis(3-aminopropyl)trisiloxane, 1,1,5,5-tetraphenyl-3,3-dimethoxy-1,5-bis(4-aminobutyl)trisiloxane, 1,1,5,5-tetraphenyl-3,3-dimethoxy-1,5-bis(5-aminopentyl)trisiloxane, 1,1,5,5-tetramethyl-3,3-dimethoxy-1,5-bis(2-aminoethyl)trisiloxane, 1,1,5,5-tetramethyl-3,3-dimethoxy-1,5-bis(4-aminobutyl)trisiloxane, 1,1,5,5-tetramethyl-3,3-dimethoxy-1,5-bis(5-aminopentyl)trisiloxane, 1,1,3,3,5,5-hexamethyl-1,5-bis(3-aminopropyl)trisiloxane, 1,1,3,3,5,5-hexaethyl-1,5-bis(3-aminopropyl)trisiloxane, 1,1,3,3,5,5-hexapropyl-1,5-bis(3-aminopropyl)trisiloxane. These diamines may be used alone or in combinations of two or more.

The above-mentioned polyimide resins may be used alone, or if necessary they may be used as mixtures (blends) of two or more different types.

The composition of the polyimide resin must be designed so that the Tg is no higher than 100° C., and preferred diamines as starting materials for the polyimide resin include aliphatic diamines such as the polyoxyalkylenediamines JEFFAMINE D-230, D-400, D-2000, D-4000, ED-600, ED-900, ED-2001 and EDR-148 by San Techno Chemical Co., Ltd., and the polyetheramines D-230, D-400 and D-2000 by BASF. These diamines constitute preferably 1-80 mol % and more preferably 5-60 mol % of the total diamines. If the amount of these diamines is less than 1 mol % it will tend to be difficult to impart low-temperature adhesion and a hot flow property, while if it is greater than 80 mol % the Tg of the polyimide resin will be lowered, thus increasing the possibility of impairment of the selfsupporting property of the film, and therefore neither extreme is desirable.

The weight-average molecular weight of the polyimide resin is preferably limited to within the range of 10,000-200,000, more preferably 10,000-100,000 and even more preferably 20,000-80,000. If the weight-average molecular weight is within this range, the strength, flexibility and tack properties of the formed sheet or film will be adequate, while the hot flow property will also be adequate, thus helping to satisfactorily ensure good embedding properties on wiring levels on the substrate surface. If the weight-average molecular weight is less than 10,000, the film formability will be gradually impaired and the film strength will tend to be reduced, while if it is greater than 200,000 the hot flow property will be gradually impaired and the embedding property for irregularities on the substrate will tend to be reduced, and therefore neither extreme is desirable.

If the Tg and weight-average molecular weight of the polyimide resin are within these ranges, it will be possible to not only lower the attachment temperature onto semiconductor wafer back sides, but also to lower the heating temperature for adhesive anchoring of the semiconductor element to the semiconductor element-mounting supporting member (die bonding temperature), and to limit escalation in warping of the semiconductor element. It will also be possible, as a feature of the invention, to effectively impart a flow property under conditions of low temperature and low pressure and with rapidity during die bonding. When the semiconductor element-mounting supporting member is an organic substrate, it is possible to minimize sudden gasification of absorbed moisture on the organic substrate due to the heating temperature during die bonding, and to inhibit expansion of the die bonding material layer caused by the gasification. The weight-average molecular weight is the weight-average molecular weight measured in terms of polystyrene using a high-performance liquid chromatograph (trade name: C-R4A by Shimadzu Corp.).

The (B) thermosetting component comprises (B1) a compound with an allyl group and (B2) a compound with a maleimide group. The (B1) compound with an allyl group is not particularly restricted so long as it is a compound having one or more allyl groups in the molecule, but it is preferably a compound with two or more allyl groups in the molecule since it is preferred to form a crosslinked structure by thermosetting. Examples of such compounds include diallylbisphenol A, diallylbisphenol A diglycidyl ether or its polycondensate, bisallylnadimide, diallyl phthalate or diallyl phthalate prepolymer, diallylmelamine, triallyl isocyanurate, allyl group-modified phenol-novolac, 1,3-diallyl-5-glycidyl isocyanurate, and the like. Any of these may be used alone or in combinations of two or more. From the viewpoint of imparting a hot flow property in the B stage there are preferably used diallylbisphenol A, diallylbisphenol A diglycidyl ether, or 1,3-diallyl-5-glycidyl isocyanurate which are liquid at ordinary temperature, while bisallylnadimide and diallylbisphenol A diglycidyl ether or its polycondensate is preferably used from the viewpoint of low outgas in the B stage.

The (B1) compound with an allyl group is preferably a compound also having an epoxy group, since this will more sufficiently satisfy the requirements of low-temperature attachment property and reflow resistance. The number of epoxy groups per molecule is preferably two or more. Examples of compounds having allyl and epoxy groups include diallylbisphenol A diglycidyl ether and 1,3-diallyl-5-glycidyl isocyanurate, mentioned above, as well as 1-allyl-3,5-diglycidyl isocyanurate, monofunctional allyl glycidyl ether and the like. Diallylbisphenol A diglycidyl ether or its polycondensate is preferably used among these.

The content of the (B1) compound with an allyl group in the adhesive composition of the invention is preferably 1-200 parts by mass, more preferably 5-100 parts by mass and even more preferably 5-50 parts by mass with respect to 100 parts by mass of the (A) thermoplastic resin, from the viewpoint of satisfactory hot flow properties and low outgas in the B stage, and heat resistance in the C stage. If the content is less than 1 part by mass the effect of obtaining both of the aforementioned properties will tend to be reduced, while if it exceeds 200 parts by mass the amount of outgas will tend to be increased during heating and the film formability and handleability will tend to be gradually impaired, and therefore neither extreme is desirable.

The (B2) compound with a maleimide group in the adhesive composition of the invention is not particularly restricted so long as it is a compound having one or more maleimide groups per molecule, but since it is preferred to form a crosslinked structure by thermosetting, it is preferably a compound having two or more maleimide groups in the molecule, such as a bismaleimide compound represented by the following formula (1) or a novolac-type maleimide compound represented by the following formula (2).

$R^1$ in the following formula (1) is not particularly restricted so long as it is a divalent organic group containing an aromatic ring and/or a straight-chain, branched or cyclic aliphatic hydrocarbon group, but it is preferably a benzene residue, toluene residue, xylene residue or naphthalene residue, or a straight-chain, branched or cyclic alkyl group, or a mixture of such groups. The letter n in the following formula (2) represents an integer of 0-20. The (B2) compound with a maleimide group is preferably a bismaleimide compound represented by the following formula (1), wherein $R^1$ is a group represented by the following formula (3), (4) or (5), or a novolac-type maleimide compound represented by the following formula (2), from the viewpoint of effectively imparting heat resistance and high-temperature adhesive force to the adhesive composition in the C stage.

[Chemical Formula 1]

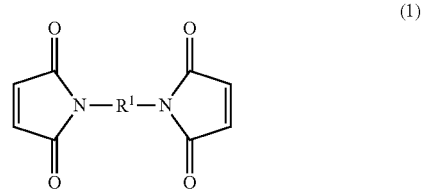

(1)

[Chemical Formula 2]

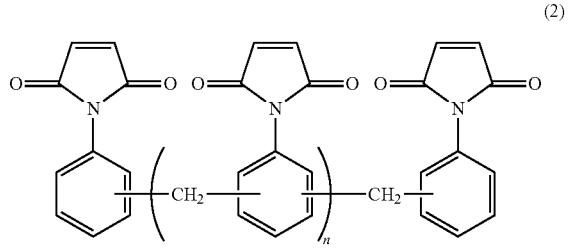

(2)

[Chemical Formula 3]

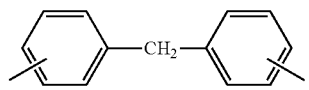
(3)

[Chemical Formula 4]

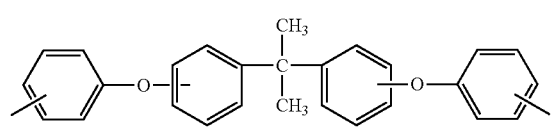
(4)

[Chemical Formula 5]

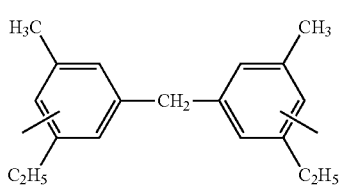
(5)

The content of the (B2) compound with a maleimide group in the adhesive composition of the invention is preferably 1-200 parts by mass, more preferably 5-100 parts by mass and even more preferably 5-50 parts by mass with respect to 100 parts by mass of the (A) thermoplastic resin, from the viewpoint of film formability, low outgas in the B stage, and heat resistance in the C stage. If the content is less than 1 part by mass the effect of improving the aforementioned properties will tend to be reduced, while if it exceeds 200 parts by mass the amount of outgas will tend to be increased during heating, the film formability and handleability will tend to be gradually impaired and the cured film will tend to be brittle, and therefore neither extreme is desirable.

While the details regarding the mechanism of thermal reaction between allyl groups and maleimide groups is not fully understood, Ene reaction between allyl groups and maleimide groups, and three-dimensional structure formation by Diels-Alder reaction, has been reported (Reference: K. Ambika Devi, C. P. Reghunadhan Nair, K. N. Ninan, J. Appl. Polym. Sci., vol. 106, 1192 (2007)). The curing system has low cure shrinkage, and tends to produce an effect of reducing chip warping or inhibiting increase in chip warping.

An organic peroxide may be used if necessary to accelerate heat curing of the (B1) compound with an allyl group and (B2) compound with a maleimide group. In this case, an organic peroxide with a 1 minute half-life temperature of 120° C. or higher is preferred from the viewpoint of inhibiting curing during preparation of the film and of storage stability in the B stage.

The (B) thermosetting component used for the invention may employ, in addition to the (B1) compound with an allyl group and the (B2) compound with a maleimide group, also components comprising reactive compounds that produce crosslinking reaction by heat, without any particular restrictions. Examples of reactive compounds that produce crosslinking reaction by heat include epoxy resins, cyanate ester resins, phenol resins, urea resins, melamine resins, alkyd resins, acrylic resins, unsaturated polyester resins, silicone resins, resorcinol-formaldehyde resins, xylene resins, furan resins, polyurethane resins, ketone resins, triallyl cyanurate resins, polyisocyanate resins, tris(2-hydroxyethyl)isocyanurate-containing resins, triallyl trimellitate-containing resins, thermosetting resins synthesized from cyclopentadiene, and thermosetting resins obtained by trimerization of aromatic dicyanamides, as well as polyfunctional acrylate and/or methacrylate compounds, styryl group-containing compounds, and the like. Of these, epoxy resins are preferred from the viewpoint of allowing excellent adhesive force at high temperature to be imparted. These thermosetting resins may be used alone or in combinations of two or more.

The content of the (B) thermosetting component in the adhesive composition is preferably 1-200 parts by mass, more preferably 5-100 parts by mass and even more preferably 5-50 parts by mass, with respect to 100 parts by mass of the (A) thermoplastic resin. If the content exceeds 200 parts by mass, outgas during heating will be increased and the film formability (toughness) will tend to be gradually impaired, while if the content is less than 1 part by mass, it will become increasingly impossible to effectively impart a hot flow property in the B stage and heat resistance and high-temperature adhesion in the C stage, and therefore neither extreme is desirable.

For curing of the (B) thermosetting component, the adhesive composition may employ the aforementioned organic peroxides, as well as curing agents and catalysts, and if necessary it may combine a curing agent and curing accelerator or a catalyst and co-catalyst. The amounts of addition of the curing agent, curing accelerator, catalyst, co-catalyst and organic peroxide, and whether or not they are added, are determined and adjusted in ranges that can ensure the desirable hot flow property, curability and post-curing heat resistance described below.

The (B3) epoxy resin, as a preferred component of the (B) thermosetting component, is more preferably one containing at least two epoxy groups in the molecule, and it is most preferably a phenol glycidyl ether-type epoxy resin from the viewpoint of curability and cured properties. Examples of such resins include bisphenol A-type (or AD-type, S-type and F-type) glycidyl ethers, hydrogenated bisphenol A-type glycidyl ethers, ethylene oxide adduct bisphenol A-type glycidyl ethers, propylene oxide adduct bisphenol A-type glycidyl ethers, phenol-novolac resin glycidyl ethers, cresol-novolac resin glycidyl ethers, bisphenol A-novolac resin glycidyl ethers, naphthalene resin glycidyl ethers, trisphenolmethane-type and other trifunctional (or tetrafunctional) glycidyl ethers, dicyclopentadienephenol resin glycidyl ethers, dimer acid glycidyl esters, trifunctional (or tetrafunctional) glycidylamines, naphthalene resin glycidylamines, and the like. These may be used alone or in combinations of two or more.

From the viewpoint of preventing electromigration and corrosion of metal conductor circuits, such (B3) epoxy resins are preferably high-purity products with a content of no greater than 300 ppm for impurity ions such as alkali metal ions, alkaline earth metal ions and halide ions, and particularly chloride ion or hydrolyzable chlorine.

When a (B3) epoxy resin is used, a curing agent may also be used as necessary. As examples of curing agents there may be mentioned phenol-based compounds, aliphatic amines, alicyclic amines, aromatic polyamines, polyamides, aliphatic acid anhydrides, alicyclic acid anhydrides, aromatic acid anhydrides, dicyandiamides, organic acid dihydrazides, boron trifluoride amine complexes, imidazoles and tertiary amines. Phenol-based compounds are preferred among these, with phenol-based compounds having at least two phenolic hydroxyl groups in the molecule being more preferred. Examples of such compounds include phenol-novolac resins, cresol-novolac resins, t-butylphenol-novolac resins, dicyclopentadienecresol-novolac resins, dicyclopentadienephenol-novolac resins, xylylene-modified phenol-novolac resins, naphthol-based compounds, trisphenol-based compounds, tetrakisphenol-novolac resins, bisphenol A-novolac resins, poly-p-vinylphenol resins, phenolaralkyl resins, and the like. Compounds with a number-average molecular weight in the range of 400-1500 are preferred among these. Using such curing agents can effectively reduce outgas, which can cause contamination of the semiconductor element or apparatus during the heating for semiconductor device assembly. In order to ensure cured heat resistance as well, the content of such phenol-based compounds is preferably adjusted to be between 0.95:1.05 and 1.05:0.95, as the equivalent ratio of epoxy equivalents of the epoxy resin to OH equivalents of the phenol-based compound.

A curing accelerator may also be used if necessary. The curing accelerator is not particularly restricted so long as it cures the thermosetting resin, and as examples there may be mentioned imidazoles, dicyandiamide derivatives, dicarboxylic acid dihydrazides, triphenylphosphine, tetraphenylphosphoniumtetraphenyl borate, 2-ethyl-4-methylimidazole-tetraphenyl borate and 1,8-diazabicyclo[5.4.0]undecene-7-tetraphenyl borate.

The adhesive composition of the invention preferably further contains (C) a filler. Examples for the (C) filler include metal fillers such as silver powder, gold dust, copper powder and nickel powder, inorganic fillers such as alumina, aluminum hydroxide, magnesium hydroxide, calcium carbonate, magnesium carbonate, calcium silicate, magnesium silicate, calcium oxide, magnesium oxide, aluminum oxide, aluminum nitride, crystalline silica, amorphous silica, boron nitride, titania, glass, iron oxide and ceramics, and organic fillers such as carbon and rubber-based fillers, without any particular restrictions on the type or form.

The (C) filler may be selected for use according to the desired function. For example, a metal filler is added to impart conductivity, thermal conductivity or a thixotropic property to the adhesive composition, a non-metal inorganic filler is added to impart thermal conductivity, a low thermal expansion property or low hygroscopicity to the adhesive layer, and an organic filler is added to impart toughness to the adhesive layer. These metal fillers, inorganic fillers or organic fillers may be used alone or in combinations of two or more. Metal fillers, inorganic fillers and insulating fillers are preferred among these from the viewpoint of imparting conductivity, thermal conductivity, a low moisture absorption property and an insulating property, which are required for semiconductor device adhesive materials, and among inorganic fillers and insulating fillers there are preferred boron nitride fillers or silica fillers from the viewpoint of satisfactory dispersibility in resin varnishes and high adhesive force when hot.

The amount of (C) filler used is determined based on the properties or functions to be imparted, but it is preferably 1-40 vol %, more preferably 5-30 vol % and even more preferably 5-20 vol %, based on the total of the resin component and filler in the adhesive composition. Appropriately increasing the amount of (C) filler provides low adhesion for the film surface and a high elastic modulus, and can effectively improve the dicing property (the cutting property with a dicer blade), pickup property (detachability from the dicing tape), wire bonding property (ultrasonic efficiency) and hot bonding strength. Increasing the amount of (C) filler beyond the necessary level will impair the low-temperature attachment property, interfacial adhesion with adherends and hot flow property, which are features of the invention, while also potentially lowering the reliability including reflow resistance, and therefore the amount of filler used is preferably kept within the range specified above. The optimal filler content is preferably determined so that a balance between the desired properties is obtained. In cases where a (C) filler is used, mixing and kneading may be accomplished using an appropriate combination of dispersers such as an ordinary stirrer, kneader, triple roll, ball mill or the like.

Various types of coupling agents may also be added to the adhesive composition of the invention to improve the interfacial bonding between different types of materials. Examples of coupling agents include silane-based, titanium-based and aluminum-based agents, among which silane-based coupling agents are preferred for a greater effect. The amount of coupling agent used is preferably 0.01-20 parts by mass with respect to 100 parts by mass of the (A) thermoplastic resin, from the standpoint of the effect, heat resistance and cost.

An ion scavenger may also be added to the adhesive composition of the invention to adsorb ionic impurities and improve the insulating reliability when wet. There are no particular restrictions on such ion scavengers, and examples thereof include compounds known as copper inhibitors to prevent ionization and dissolution of copper, such as triazinethiol compounds and bisphenol-based reducing agents, as well as inorganic ion adsorbents such as zirconium-based and antimony bismuth-based magnesium aluminum compounds. The amount of ion scavenger used is preferably 0.01-10 parts by mass with respect to 100 parts by mass of the (A) thermoplastic resin, from the viewpoint of effect of the addition, heat resistance and cost.

According to the invention, softening agents, age inhibitors, coloring agents, flame retardants and tackifiers such as terpene-based resins may be added to the adhesive composition, as appropriate.

A method for producing a film-like adhesive 1 employing an adhesive composition of the invention will now be explained. First, each of the components for the adhesive composition (the (A) thermoplastic resin, (B) thermosetting component, and if necessary the (C) filler and other components) are mixed in an organic solvent, and the mixture is kneaded if necessary, to prepare a varnish (adhesive layer-forming varnish). The mixing and kneading for preparation of the varnish can be accomplished by an appropriate combination of common dispersers such as a stirrer, kneader, triple roll or ball mill. The varnish may then be coated onto a base film and heat dried to form an adhesive layer, and the base film removed to obtain a film-like adhesive 1. The conditions for the heat drying are not particularly restricted so long as they are conditions under which the organic solvent in the varnish sufficiently volatilizes off, but for most purposes heating is conducted at 50-200° C. for 0.1-90 minutes.

The organic solvent used for production of the adhesive layer, i.e. the organic solvent in the varnish, is not particularly restricted so long as it allows each component to be uniformly dissolved, kneaded or dispersed, and examples include dimethylformamide, dimethylacetamide, N-methyl-2-pyrrolidone, dimethyl sulfoxide, diethyleneglycol dimethyl ether, toluene, benzene, xylene, methyl ethyl ketone, methyl isobutyl ketone, tetrahydrofuran, ethylcellosolve, ethylcellosolve acetate, butylcellosolve, dioxane, cyclohexanone and ethyl acetate.

The base film used for production of the film-like adhesive 1 of the invention is not particularly restricted so long as it can withstand the heating and drying conditions, and examples include polyester films, polypropylene films, polyethylene terephthalate films, polyimide films, polyetherimide films, polyether naphthalate films and methylpentene films. A film used as the base may also be a multilayer film comprising a combination of two or more different types, and the surface may be treated with a silicone-based or silica-based release agent.

Coating of the varnish onto the base film may be on only one main side or on both main sides of the base film. The base film used in this case is the same type as the base film 2 shown in FIG. 2. Once the film-like adhesive 1 has been formed, it may be used as the film-like adhesive 1 after removal of the base film 2, or it may be used as an adhesive sheet without removing the base film 2.

Figure 4:
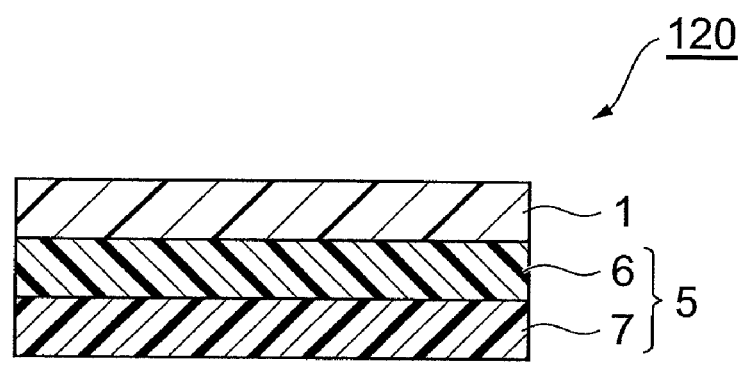
FIG. 4 is a schematic cross-sectional view showing another embodiment of an adhesive sheet of the invention.
Figure 5:
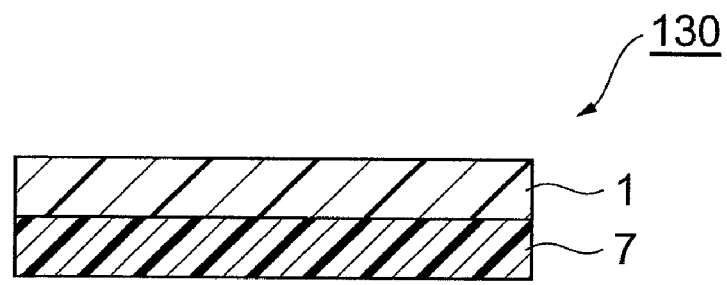
FIG. 5 is a schematic cross-sectional view showing another embodiment of an adhesive sheet of the invention.

FIG. 4 is a schematic cross-sectional view showing another embodiment of an adhesive sheet of the invention. The adhesive sheet 120 has a construction in which the film-like adhesive 1 is laminated on the pressure-sensitive adhesive layer 6 of a dicing sheet 5, which is a support substrate comprising the pressure-sensitive adhesive layer 6 formed on one main side of a base film 7. The base film 7 may be the same type as the base film 2 described above. The film-like adhesive 1 of the adhesive sheet 120 is preferably pre-formed (precut) to a shape resembling the semiconductor wafer to which it is to be attached. The adhesive sheet of the invention may be provided with a dicing sheet comprising only the base film 7, instead of the dicing sheet 5 of the adhesive sheet 120. FIG. 5 is a schematic cross-sectional view showing another embodiment of the adhesive sheet of the invention, wherein the adhesive sheet 130 has a construction in which the film-like adhesive 1 is laminated on one main side of the base film 7. For the purpose of simplifying the semiconductor device production steps, the adhesive sheets 120 and 130 are dicing/die bonding integrated film-like adhesives comprising at least a film-like adhesive 1 and a dicing sheet 5 or a base film 7 that can ensure elongation (commonly known as "expansion") when pulling tension is applied. That is, these adhesive sheets exhibit all of the properties that are required for dicing sheets and die bonding films.

Thus, a structure wherein a pressure-sensitive adhesive layer 6 that performs the function as a dicing sheet is provided on the base film 7 and a film-like adhesive 1 of the invention that performs the function as a die bonding film is laminated on the pressure-sensitive adhesive layer 6, or a structure wherein the aforementioned expandable base film 7 and film-like adhesive 1 are attached together, exhibits the function of a dicing sheet during dicing and of a die bonding film during die bonding. Therefore, the adhesive sheets 120 and 130 are laminated on the back side of a semiconductor wafer while heating the film-like adhesive 1, and after dicing, they may be used by pickup as a film-like adhesive-attached semiconductor element.

The pressure-sensitive adhesive layer 6 is formed of a pressure-sensitive or radiation-curable pressure-sensitive adhesive. The pressure-sensitive adhesive layer 6 is not particularly restricted so long as it has sufficient pressure-sensitive adhesive force so that the semiconductor element does not fly off during dicing and it has sufficiently low pressure-sensitive adhesive force so that the semiconductor element is not damaged during the subsequent semiconductor element pickup step, and any conventionally known one may be used. For example, a radiation curable pressure-sensitive adhesive facilitates control of the pressure-sensitive adhesive force, by allowing high pressure-sensitive adhesive force during dicing and low pressure-sensitive adhesive force during the pickup after dicing, by the irradiation before pickup.

The base film 7 is not particularly restricted so long as it is a film that can ensure elongation (commonly known as "expansion") when pulling tension is applied, but a film made of a polyolefin material is preferably used.

The adhesive composition and film-like adhesive of the invention, as described above, can be used as a die bonding adhesive material for attachment between semiconductor elements such as ICs and LSIs, and adherends made of semiconductor element-mounting supporting members, including lead frames such as 42 alloy lead frames and copper lead frames; plastic films made of polyimide resins, epoxy resins and the like; substrates such as nonwoven glass fabrics impregnated and cured with plastics such as polyimide resins or epoxy resins; and ceramics such as alumina. They are most preferably used as die bonding adhesive materials for bonding between semiconductor elements and organic substrates with irregularities on the surface, such as organic substrates provided with organic resist layers on the surface or organic substrates having wiring on the surface.

The adhesive composition and film-like adhesive of the invention are also preferably used as adhesive materials for bonding between adjacent semiconductor elements in a semiconductor device having a structure of stacked semiconductor elements (Stacked-PKG).

The use of the film-like adhesive of the invention will now be explained in detail, with reference to a drawing of a semiconductor device comprising a film-like adhesive according to the invention. Incidentally, semiconductor devices with various structures have been proposed in recent years, and use of the film-like adhesive of the invention is not limited to semiconductor devices having the structures described below.

Figure 6:
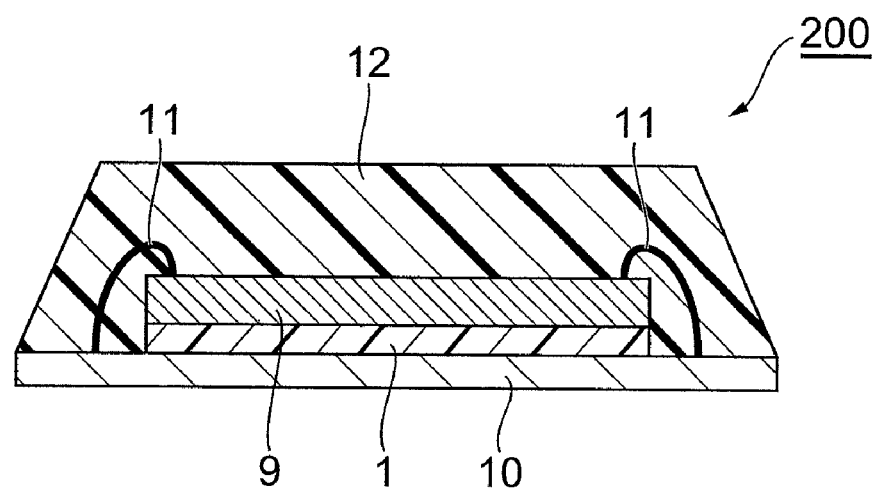
FIG. 6 is a schematic cross-sectional view showing an embodiment of a semiconductor device according to the invention.

FIG. 6 is a schematic cross-sectional view showing an embodiment of a semiconductor device according to the invention. The semiconductor device 200 shown in FIG. 6 has a construction wherein a semiconductor element 9 is bonded to a supporting member 10 via a die bonding layer 1 formed by the film-like adhesive described above, and the connecting terminals (not shown) of the semiconductor element 9 are electrically connected to external connecting terminals (not shown) via wires 11, and sealed with a sealing material 12.

Figure 7:
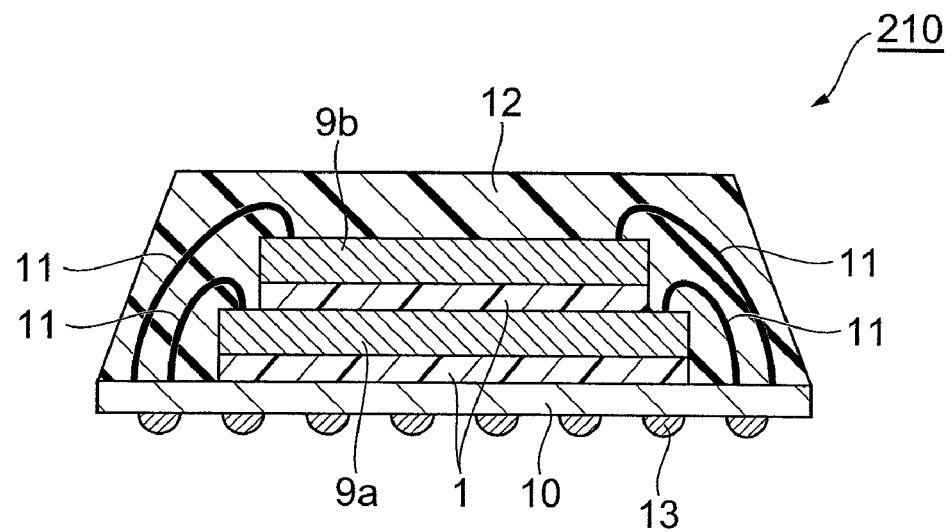
FIG. 7 is a schematic cross-sectional view showing another embodiment of a semiconductor device according to the invention.

FIG. 7 is a schematic cross-sectional view showing another embodiment of a semiconductor device according to the invention. The semiconductor device 210 shown in FIG. 7 has a construction wherein a first level semiconductor element 9a is bonded to a supporting member 10 on which a terminal 13 has been formed via a die bonding layer 1 formed by the film-like adhesive described above, and a semiconductor element 9b is bonded onto the semiconductor element 9a via a die bonding layer 1 formed by the film-like adhesive described above, with the entirety being sealed by a sealing material 12. The connecting terminals (not shown) of the semiconductor element 9a and semiconductor element 9b are electrically connected with external connecting terminals via respective wires 11.

The semiconductor devices (semiconductor packages) shown in FIG. 6 and FIG. 7 can be produced, for example, by sandwiching a film-like adhesive of the invention between a semiconductor element and a semiconductor element-mounting supporting member, performing thermocompression bonding to bond them together, and then passing the body through a wire bonding step, and if necessary also a sealing step with a sealing material. The heating temperature for the thermocompression bonding step is normally 20-250° C., the load is normally 0.01-20 kgf and the heating time is normally 0.1-300 seconds.

EXAMPLES

The present invention will now be explained in greater detail based on examples and comparative examples, with the understanding that the invention is in no way limited to the examples.

<Synthesis of Polyimide Resin (PI-1)>

In a 300 mL flask equipped with a thermometer, stirrer, condenser tube and nitrogen inlet tube there were charged 12.42 g of 1,3-bis(3-aminopropyl)tetramethyldisiloxane (trade name: LP-7100, by Shin-Etsu Chemical Co., Ltd.), 22.62 g of polyoxypropylenediamine (trade name: D400, by BASF, molecular weight: 452.4) and 140 g of N-methyl-2-pyrrolidone, and the reaction mixture was stirred. After dissolution of the diamine, 32.62 g of 4,4'-oxydiphthalic acid dianhydride that had been previously purified from acetic anhydride by recrystallization was added in small portions at a time, while cooling the flask in an ice bath. After reaction for 8 hours at room temperature (25° C.), 80.5 g of xylene was added, and the mixture was heated at 180° C. while blowing in nitrogen gas to azeotropically remove the xylene with water to obtain a polyimide resin (PI-1) varnish. GPC measurement of the obtained polyimide resin yielded values of number-average molecular weight Mn=14,000 and weight-average molecular weight Mw=35,000, based on polystyrene. The Tg of the obtained polyimide resin was 45° C.

<Synthesis of Polyimide Resin (PI-2)>

In a 300 mL flask equipped with a thermometer, stirrer, condenser tube and nitrogen inlet tube there were charged and stirred 20.52 g of 2,2-bis(4-aminophenoxyphenyl)propane and 10.20 g of 4,9-dioxadecane-1,12-diamine, as monomers, and 193.5 g of N-methyl-2-pyrrolidone as an organic solvent, to obtain a reaction mixture having each of the diamines dissolved in the organic solvent. Next, 52.20 g of decamethylenebistrimellitate dianhydride was added to the reaction mixture in small portions at a time, and the mixture was heated at 180° C. for 5 hours while blowing in nitrogen gas to promote reaction, and the water generated was removed out of the system to obtain a polyimide resin (PI-2) varnish. GPC measurement of the molecular weight of the obtained polyimide resin yielded values of number-average molecular weight Mn=28,900 and weight-average molecular weight Mw=88,600, based on polystyrene. The Tg of the obtained polyimide resin was 73° C.

<Synthesis of Polyimide Resin (PI-3)>

In a 500 ml flask equipped with a thermometer, stirrer, condenser tube and nitrogen inlet tube there were charged and stirred 41.00 g of 2,2-bis(4-aminophenoxyphenyl)propane and 279.6 g of N-methyl-2-pyrrolidone. After dissolution of the diamine, 52.20 g of decamethylenebistrimellitate dianhydride previously purified by recrystallization with acetic anhydride was added in small portions at a time, while stirring the flask in an ice bath. After reaction for 8 hours at room temperature, 186.4 g of xylene was added, the mixture was heated at 180° C. while blowing in nitrogen gas, and the xylene was azeotropically removed with water. The reaction mixture was poured into a large amount of water, and the precipitated polymer was separated by filtration and dried to obtain polyimide resin (PI-3). GPC measurement of the obtained polyimide resin yielded values of number-average molecular weight Mn=22,800 and weight-average molecular weight Mw=121,000, based on polystyrene. The Tg of the obtained polyimide resin was 120° C.

Examples 1-5, Comparative Examples 1-4

Each of the polyimide resins (PI-1 to –3) obtained as described above were used for mixing of the components in the compositional ratios listed in Tables 1 and 2 (units: parts by mass), to obtain adhesive compositions (adhesive layer-forming varnishes).

The denotations for the components in Tables 1 and 2 have the following meanings.

BPA-CA: 2,2'-bis(3-Allyl-4-hydroxyphenyl)propane, product of Konishi Chemical Industry Co., Ltd.

RE-810NM: Diallylbisphenol A diglycidyl ether, product of Nippon Kayaku Co., Ltd.

BANI-X: Xylylene-type bisallylnadimide, product of Maruzen Petrochemical Co., Ltd.

DA-MGIC: 1,3-Diallyl-5-glycidyl isocyanurate, product of Shikoku Chemicals Corp.

BMI-1: 4,4'-Bismaleimidediphenylmethane, product of Tokyo Kasei Kogyo Co., Ltd.

BMI-2: 2,2'-bis-[4-(4-Maleimidephenoxy)phenyl]propane (BMI-80), product of K-I Chemical Industry Co., Ltd.

ESCN-195: Cresol-novolac-type solid epoxy resin (epoxy equivalents: 200), product of Sumitomo Chemical Co., Ltd.

TrisP-PA: α,α,α'-tris(4-Hydroxyphenyl)-1-ethyl-4-isopropylbenzene (OH equivalents: 141), product of Honshu Chemical Industry Co., Ltd.

TPPK: Tetraphenylphosphonium tetraphenylborate, product of Tokyo Kasei Kogyo Co., Ltd.

HP-P1: Boron nitride filler, product of Mizushima Ferroalloy Co., Ltd.

NMP: N-methyl-2-pyrrolidone, product of Kanto Kagaku Co., Ltd.

Each of the obtained adhesive layer-forming varnishes was coated onto a base (release agent-treated PET film, 50 μm thickness) to a post-drying thickness of 40 μm±5 μm, and then heat dried in an oven at 80° C. for 30 minutes and then at 120° C. for 30 minutes to obtain adhesive sheets for Examples 1-5 and Comparative Examples 1-4 having film-like adhesives formed on bases.

<Measurement of Flow Volume>

An adhesive sheet formed with a film-like adhesive in the B-stage state, prepared to a thickness of 40 μm onto a 50 μm-thick PET substrate, obtained for each of the examples and comparative examples, was cut to a 10 mm×10 mm size to form a test piece. The test piece was sandwiched between two slide glasses (76 mm×26 mm×1.0-1.2 mm thickness, product of Matsunami Glass Industries, Ltd.) and thermocompression bonded for 90 seconds while applying a load of 100 kgf/cm$^2$ over the entirety on a heating plate at 150° C. or 200° C. The degrees of runover of the film-like adhesive from the four sides of the PET substrate after thermocompression bonding were measured with an optical microscope, and the average value was recorded as the flow volume. The B stage is the condition after the adhesive layer-forming varnish has been coated onto the PET substrate and heated in an oven for 30 minutes at 80° C., and then for 30 minutes at 120° C. A larger flow volume value corresponds to a more excellent hot flow property in the B stage, and a more excellent filling property (embedding property) with respect to irregularities on the adherend surface. The results are shown in Tables 1 and 2.

<Measurement of Chip Warping>

Each of the film-like adhesives of the adhesive sheets obtained in the examples and comparative examples (10 mm×10 mm×40 μm thickness) was used for thermocompression bonding of a silicon chip (10 mm×10 mm×75 μm thickness) onto a glass epoxy substrate (20 mm×20 mm×105 μm thickness), under conditions of 150° C. for the film-like adhesives of Examples 1-3 and 5 and Comparative Examples 1, 3 and 4, 180° C. for the film-like adhesive of Example 4 and 250° C. for the film-like adhesive of Comparative Example 2, under conditions with a load of 1 kgf/chip and a time of 10 seconds, and after heat curing in an oven at 150° C. for 1 hour, a SE-2300 surface roughness measuring instrument by Kosaka Laboratory, Ltd. was used to measure the degree of warping of the convexities on the silicon chip side at room temperature, with a measuring distance of 10 mm in the diagonal direction of the silicon chip. The results are shown in Tables 1 and 2.

<Measurement of 260° C. Peel Strength>

Each of the film-like adhesives of the adhesive sheets obtained in the examples and comparative examples (5 mm×5 mm×40 μm thickness) was used for thermocompression bonding of a silicon chip (5 mm×5 mm×400 μm thickness) onto a 42 alloy lead frame, under conditions of 150° C. for the film-like adhesives of Examples 1-3 and 5 and Comparative Examples 1, 3 and 4, 180° C. for the film-like adhesive of Example 4 and 250° C. for the film-like adhesive of Comparative Example 2, under conditions with a load of 1 kg/chip and a time of 5 seconds, and heat curing was performed in an oven at 150° C. for 1 hour or at 180° C. for 1 hour.

This was then heated on a heating plate at 260° C. for 20 seconds, and the adhesive force evaluator shown in FIG. 8 was used to measure the strength at which the silicon chip 9 peeled using a measuring speed of 0.5 mm/sec, with the value being recorded as the 260° C. peel strength. Also, the 260° C. peel strength after moisture absorption is the value of the peel strength of the silicon chip 9 measured at 260° C. in the same manner as described above, after the sample thermocompression bonded under the conditions specified above has been heat cured in an oven at 180° C. for 5 hours, and then allowed to stand for 48 hours in a thermo-hygrostat at 85° C., 85% RH. A greater peel strength corresponds to more excellent reflow resistance, and a more satisfactory degree of reliability of the semiconductor device. Also, a greater peel strength after heat curing at 150° C. can inhibit flow caused by the wire bond thermal history, and thus results in more excellent ultrasonic efficiency during wire bonding. The results are shown in Tables 1 and 2.

In the adhesive force evaluator 300 shown in FIG. 8, a handle 32 is provided, at a variable angle around a fulcrum 33, at the end of a rod mounted on a push-pull gauge 31. Also, measurement of the 260° C. peel strength was accomplished by placing the laminated body, comprising a silicon wafer 9 with a protrusion and a 42 alloy lead frame 35 bonded via a film-like adhesive 1, on a heating plate 36 at 260° C. and, with the handle 32 engaged with the protrusion of the silicon wafer 9, using a push-pull gauge 31 to measure the peel stress when the handle 32 was moved at 0.5 mm/sec.

<Evaluation of Low-Temperature Attachment Property>

The obtained adhesive sheet was cut to 10 mm width and 40 mm length, to obtain a substrate-attached film-like adhesive. Each of the substrate-attached film-like adhesives was laminated on the back side of a silicon wafer (6-inch diameter, 400 μm thickness) placed on a support stage (the side opposite the support stage) by pressing with a roll (temperature: 100° C., linear pressure: 4 kgf/cm, feed rate: 0.5 m/min), with the film-like adhesive side as the silicon wafer side.

Each sample prepared in this manner was subjected to a 90° peel test at room temperature using a rheometer (STROGRAPH E-S (trade name) by Toyo Seiki Seisakusho, Ltd.), for measurement of the peel strength between the substrate-attached film-like adhesive and silicon wafer. Samples with a peel strength of 2 N/cm or greater were evaluated as "A", and samples with less than 2 N/cm were evaluated as "B", based on the measurement results. The results are shown in Tables 1 and 2.

TABLE 1

| Component | | Example 1 | Example 2 | Example 3 | Example 4 | Comp. Ex. 1 | Comp. Ex. 2 |
|---|---|---|---|---|---|---|---|
| Polyimide resin | PI-1 | 100 | 100 | 100 | — | 100 | — |
| | PI-2 | — | — | — | 100 | — | — |
| | PI-3 | — | — | — | — | — | 100 |
| Allyl compound | BPA-CA | 20 | — | — | 20 | — | 20 |
| | RE-810NM | — | 20 | — | — | — | — |
| | BANI-X | — | — | 20 | — | — | — |
| Maleimide compound | BMI-1 | 20 | 20 | — | 20 | — | 20 |
| | BMI-2 | — | — | 20 | — | — | — |
| Epoxy resin | ESCN195 | 20 | — | 20 | 20 | 20 | 20 |
| Epoxy resin curing agent | TrisP-PA | — | — | 10 | — | 10 | — |
| Epoxy resin curing accelerator | TPPK | 0.2 | 0.2 | 0.2 | 0.2 | 0.2 | 0.2 |
| Filler | HP-P1 | 15.0 | 15.0 | 15.0 | 15.0 | 15.0 | 15.0 |
| Solvent | NMP | 240 | 200 | 250 | 480 | 180 | 640 |
| Flow volume (μm) | 150° C. | 1500 | 2500 | 900 | 500 | 250 | 0 |
| | 200° C. | 2500 | 3500 | 5500 | 1000 | 550 | 150 |
| Chip warping (μm) | | 10 | 5 | 20 | 30 | 30 | 150 |
| 260° C. Peel strength (N/chip) | Curing at 150° C., 1 hr | 15.0 | 16.0 | 13.0 | 12.0 | 5.0 | 10.0 |
| | Curing at 180° C., 1 hr | 18.5 | 25.0 | 16.0 | 20.0 | 6.0 | 25.0 |
| | After moisture absorption | 10.0 | 19.0 | 13.0 | 15.0 | 3.0 | 20.0 |
| Low-temperature attachment property | | A | A | A | A | A | B |

TABLE 2

| Component | | Example 5 | Comp. Ex. 3 | Comp. Ex. 4 |
|---|---|---|---|---|
| Polyimide resin | PI-1 | 100 | 100 | 100 |
| | PI-2 | — | — | — |
| | PI-3 | — | — | — |
| Allyl compound | BPA-CA | — | — | — |
| | RE-810NM | — | — | — |
| | BANI-X | — | 20 | — |
| | DA-MGIC | 20 | — | — |

TABLE 2-continued

| Component | | Example 5 | Comp. Ex. 3 | Comp. Ex. 4 |
|---|---|---|---|---|
| Maleimide compound | BMI-1 | 20 | — | 20 |
| | BMI-2 | — | — | — |
| Epoxy resin | ESCN195 | 20 | 20 | 20 |
| Epoxy resin curing agent | TrisP-PA | — | 10 | 10 |
| Epoxy resin curing accelerator | TPPK | 0.2 | 0.2 | 0.2 |
| Filler | HP-P1 | 15.0 | 15.0 | 15.0 |
| Solvent | NMP | 240 | 220 | 220 |
| Flow volume | 150° C. | 1000 | 1100 | 700 |
| (μm) | 200° C. | 3500 | 4500 | 2000 |
| Chip warping (μm) | | 4 | 18 | 40 |
| 260° C. Peel strength (N/chip) | Curing at 150° C., 1 hr | 20.0 | 4.0 | 12.0 |
| | Curing at 180° C., 1 hr | 25.0 | 5.0 | 17.0 |
| | After moisture absorption | 20.0 | 3.0 | 12.0 |
| Low-temperature attachment property | | A | A | A |

As clearly seen by the results shown in Tables 1 and 2, the adhesive compositions of the examples had excellent hot flow properties and low-temperature attachment properties during low-temperature contact bonding, compared to the adhesive compositions of the comparative examples, and low chip warping after heat curing, while the 260° C. peel strengths after heat curing and after moisture absorption were also sufficiently high.

INDUSTRIAL APPLICABILITY

As explained above, it is possible according to the invention to provide a wafer back-side attachment-type adhesive composition and film-like adhesive that can be applied for ultrathin wafers and semiconductor devices comprising multiple laminated semiconductor elements. When a film-like adhesive is attached to a wafer back side, heating is usually performed to the temperature at which the film-like adhesive melts, but by using a film-like adhesive of the invention it is possible to accomplish attachment to a wafer back side at low temperature, which allows wafer warping to be minimized. This can reduce thermal stress as well, and solve the problem of warping of wafers that continue to increase in size and decrease in thickness.

Also, the adhesive composition and film-like adhesive of the invention can ensure hot flow properties that allow wiring levels on substrate surfaces to be satisfactory filled in, and can be suitably used in production steps for semiconductor devices comprising multiple laminated semiconductor elements. Furthermore, because high bonding strength at high temperature can be ensured, it is possible to increase the heat resistance and moisture-proof reliability, and to further simplify the production steps for semiconductor devices.

In addition, the adhesive composition and film-like adhesive of the invention, wherein the composition of the adhesive is optimized, can further reduce thermal stress, including inhibiting wafer warping and inhibiting chip warping caused by cure shrinkage of the film-like adhesive, while also preventing chip fly-off during dicing, and providing pickup properties, manageability during production of semiconductor devices, and low outgas properties.

According to the invention it is also possible to provide an adhesive sheet obtained by attaching the film-like adhesive and a dicing sheet. With the adhesive sheet of the invention it is possible to provide a material that simplifies the attachment steps up to the dicing step and can ensure stable properties against the thermal history of package assembly.

Also, according to the invention, it is possible to provide an adhesive sheet comprising an adhesive layer and a substrate, having both the functions of a dicing sheet and a die bond film.

Furthermore, according to the invention, it is possible to provide a semiconductor device employing the film-like adhesive described above. The semiconductor device of the invention is a semiconductor device with excellent reliability, obtained through simplified production steps. The semiconductor device of the invention exhibits the heat resistance and humidity resistance required for mounting of semiconductor elements with large differences in thermal expansion coefficient, onto semiconductor element-mounting supporting members.

EXPLANATION OF SYMBOLS

1: Film-like adhesive, 2: base film, 3: protective film, 5: dicing sheet, 6: pressure-sensitive adhesive layer, 7: base film, 9, 9a, 9b: semiconductor elements, 10: semiconductor element-mounting supporting member, 11: wire, 12: sealing material, 13: terminal, 31: push-pull gauge, 35: 42 alloy lead frame, 36: heating plate, 100, 110, 120, 130: adhesive sheets, 200, 210: semiconductor devices.

The invention claimed is:

1. An adhesive composition comprising:
   (A) a thermoplastic resin with a Tg of no higher than 100° C. and (B) a thermosetting component,
   wherein the (B) thermosetting component includes (B1) a compound with an allyl group and (B2) a compound with a maleimide group.

2. An adhesive composition according to claim 1, wherein the (A) thermoplastic resin is a polyimide resin.

3. An adhesive composition according to claim 1, wherein the (B1) compound with an allyl group is a compound further containing an epoxy group.

4. An adhesive composition according to claim 1, wherein the (B) thermosetting component further comprises (B3) an epoxy resin.

5. An adhesive composition according to claim 1, which further comprises (C) a filler.

6. An adhesive composition according to claim 1, which is used for bonding of semiconductor elements to other semiconductor elements or to semiconductor element-mounting supporting members.

7. A film-like adhesive obtained by forming an adhesive composition according to claim 1 into a film shape.

8. An adhesive sheet comprising a support substrate and a film-like adhesive according to claim 7 formed on the main side of the support substrate.

9. An adhesive sheet according to claim 8, wherein the support substrate is a dicing sheet.

10. An adhesive sheet according to claim 9, wherein the dicing sheet is one having a base film and a pressure-sensitive adhesive layer provided on the base film.

11. A semiconductor device having a structure with a semiconductor element and a semiconductor element-mounting supporting member bonded, and/or a structure with adjacent semiconductor elements bonded together, with an adhesive composition according to claim 1.

* * * * *